(12) United States Patent
Wang

(10) Patent No.: US 10,669,190 B2
(45) Date of Patent: Jun. 2, 2020

(54) ROLLER COATING DEVICE FOR PHOTOVOLTAIC GLASS COATED WITH AR COATING LIQUID

(71) Applicant: SUZHOU LAVENNANO TECHNOLOGIES INC, Jiangsu (CN)

(72) Inventor: Tao Wang, Suzhou (CN)

(73) Assignee: Lianhui Zhou, Zhangjiagang (CN)

( * ) Notice: Subject to any disclaimer, the term of this patent is extended or adjusted under 35 U.S.C. 154(b) by 237 days.

(21) Appl. No.: 15/779,511

(22) PCT Filed: Dec. 6, 2016

(86) PCT No.: PCT/CN2016/108701
§ 371 (c)(1),
(2) Date: May 25, 2018

(87) PCT Pub. No.: WO2018/086183
PCT Pub. Date: May 17, 2018

(65) Prior Publication Data
US 2018/0346373 A1    Dec. 6, 2018

(30) Foreign Application Priority Data
Nov. 8, 2016    (CN) .......................... 2016 1 0980414

(51) Int. Cl.
*C03C 17/00*    (2006.01)
*H01L 31/0216*    (2014.01)
*H01L 31/18*    (2006.01)

(52) U.S. Cl.
CPC ...... *C03C 17/002* (2013.01); *H01L 31/02168* (2013.01); *C03C 2217/73* (2013.01); *C03C 2218/118* (2013.01); *H01L 31/18* (2013.01)

(58) Field of Classification Search
CPC ....... C03C 17/002; C23D 11/00; B41F 13/00; B41F 16/00; B41F 19/00
See application file for complete search history.

(56) References Cited

U.S. PATENT DOCUMENTS 4,338,078 A  *  7/1982  Lampkin ................. C03B 29/08
                                                              198/834
4,562,093 A  *  12/1985  Mario ..................... C03B 33/04
                                                              204/192.27
(Continued)

FOREIGN PATENT DOCUMENTS

WO    WO-2013174659 A1 *  11/2013  ............... B05C 1/02
WO    WO-2014112482 A1 *  7/2014  ......... C03C 17/2453

*Primary Examiner* — Cynthia Szewczyk
(74) *Attorney, Agent, or Firm* — Luoh J. Wu; Continent Patent Office LLP

(57) ABSTRACT

The invention discloses a roll film coating device for photovoltaic glass coated with an AR coating liquid, which comprises a frame, a support roller is arranged on the upper end of the frame, and the upper end of the support roller is provided with a glass to be processed, and the frame is The middle part is provided with a column, a slide rail is arranged at the upper end of the column, and a plurality of movable bearing seats are installed in the slide rail. The column is driven by a screw to move the movable bearing seat, and the column passes left to right through the movable bearing. The seat is provided with a front roller, a rear roller and a compaction roller in this order. The coating device designed in the present invention can enhance the uniformity of glue coverage and prevent the local generation of droplets, and is suitable for the mass production of laminated photovoltaic glass. The increase of production efficiency and production quality has high practical value.

5 Claims, 1 Drawing Sheet

(56) References Cited

U.S. PATENT DOCUMENTS

2006/0196414 A1* 9/2006 Schuhmacher ....... C03C 17/002
  118/50
2014/0087546 A1* 3/2014 Harr ................... C03C 17/3476
  438/478

* cited by examiner

ROLLER COATING DEVICE FOR PHOTOVOLTAIC GLASS COATED WITH AR COATING LIQUID

TECHNICAL FIELD

The invention relates to the technical field of glass coating, in particular to a roller coating device for coating a photovoltaic glass with an AR coating liquid.

THE ART OF BACKGROUND

Solar photovoltaic glass needs better light transmittance and lowers reflectivity. However, the actual reflection of glass is difficult to make into a glass plate that meets the requirements. Therefore, it is necessary to provide an interference layer on ordinary glass and use the principle of interference of light to make it. Photovoltaic glass, hand-coated photovoltaic glass is difficult to ensure the smoothness of the film, which greatly affects the performance of the glass, and coating efficiency is low, the small coating machine on the market is difficult to adjust the film thickness, If a new roller coating device capable of rapidly adjusting the film thickness can be invented to solve such problems, a roller coating device for photovoltaic glass coated with an AR coating liquid is provided.

SUMMARY OF THE INVENTION

An object of the present invention is to provide a roller coating device for coating a photovoltaic glass with an AR coating solution so as to solve the above-mentioned problems in the background art.

To achieve the above objectives, the present invention provides the following technical solutions:

A roller coating device for coating PV glass with an AR coating liquid includes a rack, a support roller is disposed on the upper end of the rack, a glass to be processed is disposed on an upper end of the support roller, and a column is disposed in the middle of the rack. A slide rail is arranged at the upper end of the column, a plurality of movable bearing seats are mounted in the slide rail, the column is driven by a screw to move the movable bearing seat, and the column is arranged from left to right through the movable bearing seat in turn. The front roller, the rear roller, and the compaction roller, the distance between the surface of the front roller and the rear roller shaft is 1-2 mm, a glue tank is arranged between the columns, and the lower end of the glue tank passes The hose is connected with the shell, and the shape of the bottom of the mating shell is matched with the shape of the upper ends of the front roller and the rear roller, and the mating shell is used to form a film covering the upper end of the front roller and the rear roller of 1-2 mm. The mating shell is mounted on the shafts of the front and rear ends of the front roller and the rear roller through connecting edges. A front end of the frame is provided with a motor mounting platform, and a motor is installed on the motor mounting platform. The drive motor passes through The belt drives the front roller, rear roller and compaction roller and the belt passes through Pillar tension adjusting wheel, the lower end of said posts are provided with a front roller, the roller and the compaction roller corresponding to the auxiliary roller.

Preferably, the screw is a fine adjustment screw, and the lower end of the screw is hinged to the upper end of the movable bearing seat.

Preferably, guide plates are installed on both sides of the frame by bolts, and guide grooves matching the glass to be processed are arranged on the inner side of the guide plates.

Preferably, the outer ends of the front roller, the rear roller, and the compaction roller are all wrapped with rubber, and an axially parallel guide groove for storing the glue is arranged on the rear roller, and the compaction roller is arranged on the rear roller. The upper is a smooth rubber sleeve that is not textured.

Preferably, the auxiliary roller is a rubber roller, and the frame is installed on the ground with a foot screw.

Compared with the prior art, the beneficial effects of the present invention are as follows: When the device designed by the present invention is used, the front roller, the rear roller and the compaction roller are respectively adjusted to a suitable position by using a screw, since the adjustment accuracy of the screw is very good. High, so the effect is better than the adjustment of the hydraulic rod and the motor transmission, and then the glue is applied to the front and rear rollers with a matching housing that matches the shapes of the front and rear rollers. The front roller and The rotation direction of the rear roller is opposite, so that a uniform glue liquid covering groove is formed between the front roller and the rear roller to enhance the uniformity of the glue liquid covering, and then the film on the glass plate to be processed is used by the compaction roller. Flattening to prevent local droplets, suitable for mass production of coated photovoltaic glass, can effectively improve production efficiency and production quality, with high practical value.

In the picture: 1 frame, 2 support rollers, 3 columns, 4 glue tanks, 5 slides, 6 movable bearing blocks, 7 compaction rollers, 8 rear rollers, 9 drive motors, 10 motor mounting platforms, 11 front roller, 12 guide plates, 13 bolts, 14 glass plates to be processed, 15 hoses, 16 connecting edges, 17 auxiliary rollers, 18 mating housings, 19 screws, 20 adjusting wheels, 21 belts.

DETAILED DESCRIPTION

The following clearly and completely describes the technical solutions in the embodiments of the present invention with reference to the accompanying drawings in the embodiments of the present invention.

Apparently, the described embodiments are merely some but not all of the embodiments of the present invention. All other embodiments obtained by a person of ordinary skill in the art based on the embodiments of the present invention without creative efforts shall fall within the protection scope of the present invention.

Figure 1:
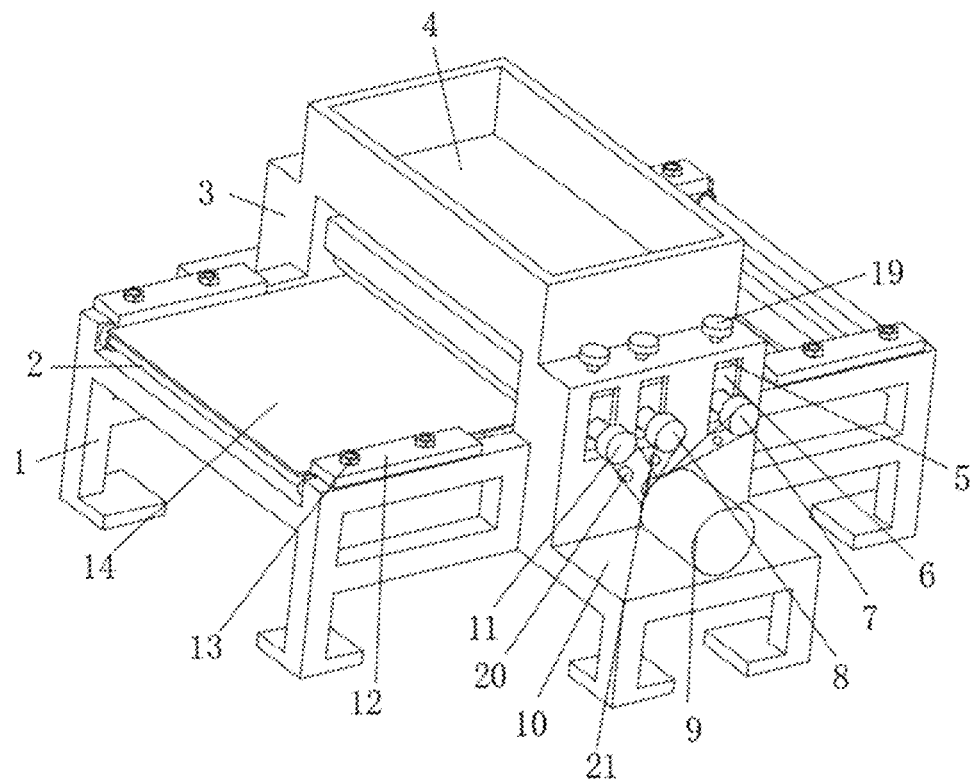
FIG. 1 is a schematic structural view of the present invention.
Figure 2:
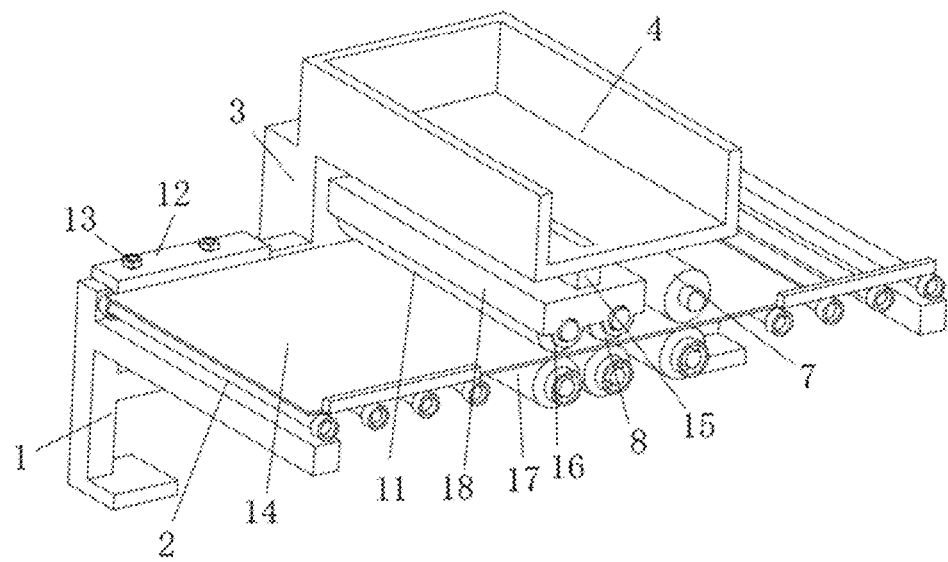
FIG. 2 is a sectional view of the structure of the present invention.

Please refer to FIGS. 1-2, the present invention provides a technical solution:

A roller coating device for coating photovoltaic glass by an AR coating liquid comprises a frame 1, a support roller 2 is arranged on the upper end of the frame 1, and an upper end of the support roller 2 is provided with a glass 14 to be processed, and the frame 1 is The middle part is provided with a column 3, the upper end of the column 3 is provided with a slide rail 5, and a plurality of movable bearing seats 6 are installed in the slide rail 5, the column 3 drives the movable bearing seat 6 by the screw 19, and the column 3 is left to The front roller 11, the rear roller 8, and the compaction roller 7 are disposed in the right through the movable bearing 6 in this order.

The surface of the front roller 11 and the rear roller shaft 8 are 1-5 mm apart, and a glue tank 4 is disposed between the columns 3. The lower end of the glue tank 4 is connected with the housing 18 through the hose 15, and the housing 18 is matched with the housing 18. The shape of the lower end matches the shape of the upper ends of the front roller 11 and the rear roller 8, and the mating housing 18 is used to form an adhesive film covering the upper end of the front roller 11 and the rear roller 8 of 1-5 mm, and the mating case 18 is connected through the connection. The side 16 is mounted on the front and rear ends of the front roller 11 and the rear roller 8. The front end of the frame 1 is provided with a motor mounting platform 10, and the motor mounting platform 10 is provided with a drive motor 9 which is driven by the belt 21 The roller 11, the rear roller 8, and the compaction roller 7 are fastened by the adjusting wheel 20 provided on the upright 3.

The lower end of the column 3 is provided with auxiliary rollers 17 respectively corresponding to the front roller 11, the rear roller 8, and the compaction roller 7. The screw 19 is a fine adjustment screw, and the lower end of the screw 19 and the upper end of the movable bearing seat 6 are provided. In an articulated manner, guide plates 12 are mounted on both sides of the frame 1 by means of bolts 13, and a guide groove matching the glass 14 to be processed is disposed on the inner side of the guide plate 12, the front roller 1, the rear roller 8, and the compaction roller. The outer ends of the 7 are all wrapped with rubber, and the 11 and the rear roller 8 are provided with an axially parallel guide groove for storing the glue liquid, and the compaction roller 7 is a smooth rubber sleeve with no lines, and an auxiliary roller. A rubber roller 17 is used, and the frame 1 is mounted on the floor using a foot screw.

When the device is in use, the front roller 11, the rear roller 8, and the compaction roller 7 are respectively adjusted to a suitable position by the screw 19, and since the adjustment accuracy of the screw 19 is high, it is more regulated than the hydraulic rod and the motor transmission device. The effect is good, and then the glue liquid is coated on the front roller 11 and the rear roller 8 using the fitting shell 18 that matches the shape of the front roller 11 and the rear roller 8, the rotation of the front roller 11 and the rear roller 8 Contrary to the contrary, a uniform glue covering groove is formed between the front roller 11 and the rear roller 8 to enhance the uniformity of the glue liquid coating, and then the film on the glass plate 14 to be processed is pressed by the compaction roller 7 Flat, to prevent the local production of droplets, suitable for mass production of laminated photovoltaic glass, can effectively improve production efficiency and production quality, with high practical value.

Although an embodiment of the present invention has been shown and described, it will be understood by those skilled in the art that various changes, modifications, substitutions, or alterations may be made to these embodiments without departing from the principle and spirit of the present invention. And variations, the scope of the invention is defined by the appended claims and their equivalents.

The invention claimed is:

1. A roller coating device for coating photovoltaic glass with AR coating solution,
comprising a frame (1), wherein a support rolling shaft (2) is arranged on the upper end of the frame (1), a to-be-processed glass (14) is configured on the upper end of the support rolling shaft (2), furthermore, a column (3) is arranged in the middle part of the frame (1), a slide rail (5) is arranged on the upper end of the column (3), and a plurality of movable bearing blocks (6) are mounted in the slide rail (5); the movable bearing block (6) is driven by the column (3) via a screw shaft (19), and moreover, the column (3) is successively provided with a front roller (11), a rear roller (8) and a compaction roller (7) through the movable bearing block (6) from left to right; the distance of the surface between the front roller (11) and the rear roller (8) is 1-5 mm; a glue liquor groove (4) is arranged among the columns (3), the lower end of the glue liquor groove (4) is connected with a coordinate jacket (18) via a hose pipe (15), and furthermore, the lower end of the coordinate jacket (18) is matched with the upper end of the front roller (11) and the rear roller (8), the coordinate jacket (18) is used for forming a 1-5 mm thickness of glue film capable of covering upper ends of the front roller (11) and the rear roller (8), the coordinate jacket (18) is mounted on the shafts at front and rear ends of the front roller (11) and the rear roller (8) via a connecting side (16); a motor mounting platform (10) is arranged in front end of the frame (1), and the motor mounting platform (10) is provided with a drive motor (9), the front roller (11), the rear roller (8) and the compaction roller (7) are driven by the drive motor via a belt (21), and moreover, the belt (21) is tensioned via a regulating wheel (20) configured on the column (3); lower ends of the column (3) are provided with auxiliary rollers (17) respectively corresponding to the front roller (11), rear roller (8) and the compaction roller (7).

2. The roller coating device for coating photovoltaic glass with AR coating solution according to claim 1, wherein the screw shaft (19) is of fine-adjustment, and the lower end of the screw shaft (19) is hinged with the upper end of the movable bearing block (6).

3. The roller coating device for coating photovoltaic glass with AR coating solution according to claim 1, wherein guide plates (12) are mounted at both sides of the frame (1) via bolts (13), and the inner side of the guide plate (12) is provided with a guide groove which is matched with the to-be-processed glass (14).

4. The roller coating device for coating photovoltaic glass with AR coating solution according to claim 1, wherein outer ends of the front roller (11), the rear roller (8) and the compaction roller (7) are wrapped by rubber, moreover, the front roller (11) and the rear roller (8) are provided with an axially-parallel guide groove convenient for the storage of glue liquor, and the compaction roller (7) is provided with a smooth rubber sleeve without threads.

5. The roller coating device for coating photovoltaic glass with AR coating solution according to claim 1, wherein the auxiliary roller (17) is a rubber roller, and the frame (1) is mounted on the ground via foot screws.

* * * * *